US011728552B2

(12) United States Patent
Sun

(10) Patent No.: US 11,728,552 B2
(45) Date of Patent: Aug. 15, 2023

(54) PHASE SHIFTER, ANTENNA, AND CONTROL METHOD OF PHASE SHIFTER

(71) Applicants: Beijing BOE Technology Development Co., Ltd., Beijing (CN); BOE TECHNOLOGY GROUP CO., LTD., Beijing (CN)

(72) Inventor: Tuo Sun, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 758 days.

(21) Appl. No.: 16/425,651

(22) Filed: May 29, 2019

(65) Prior Publication Data
US 2020/0099115 A1 Mar. 26, 2020

(30) Foreign Application Priority Data
Sep. 25, 2018 (CN) .......................... 201811115996.5

(51) Int. Cl.
*H01P 1/18* (2006.01)
*H01Q 3/36* (2006.01)

(52) U.S. Cl.
CPC ............... *H01P 1/184* (2013.01); *H01Q 3/36* (2013.01)

(58) Field of Classification Search
CPC .......... H01P 1/184; H01Q 3/36; H03K 3/013; G02F 1/13; G02F 1/13775; G01N 21/00;
(Continued)

(56) References Cited
U.S. PATENT DOCUMENTS 10,141,620 B2 * 11/2018 Jakoby ................ H01Q 9/0457
11,424,520 B2 * 8/2022 Hu ........................ G02F 1/1343
(Continued)

FOREIGN PATENT DOCUMENTS

| CN | 107046176 A | 8/2017 |
|---|---|---|
| CN | 107658547 A | 2/2018 |

(Continued)

OTHER PUBLICATIONS

CN108563050A_Description_20221110_1242.pdf (translation of CN108563050A) (Year: 2018).*
(Continued)

*Primary Examiner* — Bernarr E Gregory
*Assistant Examiner* — Yonghong Li
(74) *Attorney, Agent, or Firm* — Xsensus LLP

(57) ABSTRACT

The present disclosure provides a phase shifter, an antenna including the phase shifter, and a control method of the phase shifter. The phase shifter includes a first base substrate; a plurality of microstrip lines arranged on the first base substrate and configured to transmit an electromagnetic wave signal and apply a common voltage; a dielectric layer arranged on a side of the plurality of microstrip lines away from the first base substrate; and a plurality of separate voltage control layers correspondingly arranged with the plurality of microstrip lines respectively on a side of the dielectric layer away from the first base substrate. The separate voltage control layers are configured to apply a control voltage. A dielectric constant of the dielectric layer varies with the control voltage applied to the voltage control layers and the common voltage applied to the microstrip lines.

19 Claims, 5 Drawing Sheets

(58) Field of Classification Search
CPC ........ G01N 2021/9513; H05K 2201/01; H01S 3/1686; G03H 2250/38
See application file for complete search history.

(56) References Cited

U.S. PATENT DOCUMENTS

| | | | |
|---|---|---|---|
| 2004/0095288 A1* | 5/2004 | Jackson | H01Q 21/061 343/893 |
| 2009/0278744 A1* | 11/2009 | Kirino | H01P 1/184 343/700 MS |
| 2014/0070915 A1 | 3/2014 | Hashimoto | |

FOREIGN PATENT DOCUMENTS

| | | | | |
|---|---|---|---|---|
| CN | 107706502 A | | 2/2018 | |
| CN | 108563050 A | * | 9/2018 | ........... G02F 1/1313 |
| KR | 20060070516 A | | 6/2006 | |

OTHER PUBLICATIONS

First Office Action for CN Patent Application No. 201811115996.5 dated Mar. 3, 2021.

* cited by examiner

PHASE SHIFTER, ANTENNA, AND CONTROL METHOD OF PHASE SHIFTER

CROSS-REFERENCE

This application is based upon and claims priority to Chinese Patent Application No. 201811115996.5, filed on Sep. 25, 2018, the entire contents thereof are incorporated herein by reference.

TECHNICAL FIELD

The present disclosure relates to the field of antenna technologies, and more particularly, to a phase shifter, an antenna including the phase shifter, and a control method of the phase shifter.

BACKGROUND

In a liquid crystal antenna array based on microstrip line principles, a control voltage is applied to a liquid crystal phase shifter in the liquid crystal antenna array to control (change) arrangement of liquid crystals in the liquid crystal phase shifter, thus controlling (changing) a dielectric constant of the liquid crystal phase shifter. Therefore, changing a scanning direction of the liquid crystal antenna array may be implemented.

SUMMARY

The present disclosure provides a phase shifter, an antenna including the phase shifter, and a control method of the phase shifter.

According to an aspect of the present disclosure, there is provided a phase shifter. The phase shifter includes a first base substrate. The phase shifter includes a plurality of microstrip lines arranged on the first base substrate and configured to transmit an electromagnetic wave signal and apply a common voltage. The phase shifter includes a dielectric layer arranged on a side of the plurality of microstrip lines away from the first base substrate. The phase shifter includes a plurality of separate voltage control layers correspondingly arranged with the plurality of microstrip lines respectively on a side of the dielectric layer away from the first base substrate and configured to apply a control voltage. A dielectric constant of the dielectric layer varies with the control voltage applied to the voltage control layers and the common voltage applied to the microstrip lines.

In an arrangement of the present disclosure, the phase shifter further includes a plurality of separate first shielding layers arranged on the side of the dielectric layer away from the first base substrate. The plurality of separate first shielding layers are further used as the plurality of separate voltage control layers.

In an arrangement of the present disclosure, the phase shifter further includes a plurality of control signal lines respectively coupled to the plurality of separate first shielding layers and arranged on the side of the plurality of separate first shielding layers away from the first base substrate. The plurality of control signal lines can apply the control voltage to the plurality of separate first shielding layers.

In an arrangement of the present disclosure, the phase shifter further includes a first insulating layer arranged on the side of the plurality of separate first shielding layers away from the first base substrate. The plurality of control signal lines are located on a side of the first insulating layer away from the first shielding layer.

In an arrangement of the present disclosure, the control signal line is coupled to the first shielding layer via a through hole penetrating through the first insulating layer.

In an arrangement of the present disclosure, the first shielding layer is provided with a coupling hole. The electromagnetic wave signal is coupled to the microstrip line via the coupling hole.

In an arrangement of the present disclosure, the dielectric layer includes a liquid crystal.

In an arrangement of the present disclosure, the phase shifter further includes a second base substrate arranged opposite to the first base substrate. The control signal line and the first shielding layer are sequentially arranged on the second base substrate in a direction away from the second base substrate.

In an arrangement of the present disclosure, the plurality of separate first shielding layers are spaced apart from each other by a gap.

In an arrangement of the present disclosure, the phase shifter further includes a second shielding layer arranged on a side of the control signal line away from the first shielding layer. An orthographic projection of the second shielding layer on the first base substrate covers an orthographic projection of the gap on the first base substrate.

In an arrangement of the present disclosure, the plurality of microstrip lines are coupled to a common voltage line.

In an arrangement of the present disclosure, the plurality of control signal lines are respectively coupled to the plurality of first shielding layers via a switching unit.

According to another aspect of the present disclosure, there is provided an antenna, which includes the phase shifter according to any one of the above arrangements.

According to an arrangement of the present disclosure, the phase shifter includes a plurality of separate first shielding layers arranged on a side of the dielectric layer away from the first base substrate. The plurality of separate first shielding layers are further used as the plurality of separate voltage control layers. The phase shifter further includes a plurality of control signal lines respectively coupled to the plurality of separate first shielding layers. The antenna further includes a plurality of scanning signal lines and a plurality of switching units. The plurality of scanning signal lines intersect with the plurality of control signal lines, and the plurality of control signal lines are respectively coupled to first terminals of the plurality of switching units. The plurality of first shielding layers are respectively coupled to second terminals of the plurality of switching units, and the plurality of scanning signal lines are respectively coupled to control terminals of the plurality of switching units.

According to still another aspect of the present disclosure, there is provided a method of controlling the phase shifter according to any one of the above arrangements. The method includes: applying a common voltage to the plurality of microstrip lines; and applying a control voltage to the plurality of separate voltage control layers respectively to control a dielectric constant of a dielectric layer.

BRIEF DESCRIPTION OF THE DRAWINGS

The accompanying drawings are included to provide further understanding of the present disclosure. The accompanying drawings herein are incorporated in and constitute a part of this application, illustrate arrangements of the present disclosure and, together with the description, serve to explain the principles of the present disclosure. In the drawings:

FIG. 2d is a cross-sectional view of the phase shifter taken along Line A-A' in FIG. 2a;

DETAILED DESCRIPTION

The exemplary arrangements of the present disclosure will now be described more fully with reference to the accompanying drawings. However, these arrangements can be implemented in a variety of forms and should not be construed as limited to the examples set forth herein. Rather, these arrangements are provided so that the present disclosure will be more thorough and complete and will fully convey the concepts of present disclosure to those skilled in the art. The features, structures, or characteristics described may be combined in one or more arrangements in any suitable manner.

Spatially relative terms (e.g., "beneath", "above", "on", "below" and the like) may be used herein for ease of description to describe a relationship between one element or feature and another element or feature as illustrated in the figures. It will be understood that the spatially relative terms are intended to encompass different orientations of the device in use or operation in addition to the orientation depicted in the figures.

It will be further understood that, phraseology "include" and/or "comprise" used in this specification refers to the presence of the characteristics, integers, steps, operations, elements and/or components, but not exclusive of the presence or addition of one or more other characteristics, integers, steps, operations, elements, components and/or groups thereof.

Generally, control signal lines for changing arrangement of liquid crystal molecules in a liquid crystal phase shifter by applying a control voltage are arranged between adjacent microstrip lines in a liquid crystal antenna array and are coupled to the corresponding microstrip lines. In some cases, the number of liquid crystal phase shifter units can be significantly increased. However, a spacing between the liquid crystal phase shifter units can be decreased. In such a circumstance, the above structure in which the control signal line is arranged between the adjacent microstrip lines can cause various issues, for example, compactly arranging the phase shifter units.

In addition, if the distance between the control signal line and the microstrip line is too small, the control voltage applied on the control signal line to change the arrangement of the liquid crystal molecules in the liquid crystal phase shifter will affect the intensity of the electromagnetic wave signal on the microstrip line in the liquid crystal antenna array.

The present disclosure will be explained in detail hereinafter with reference to the accompanying drawings and exemplary arrangements.

Figure 1A:
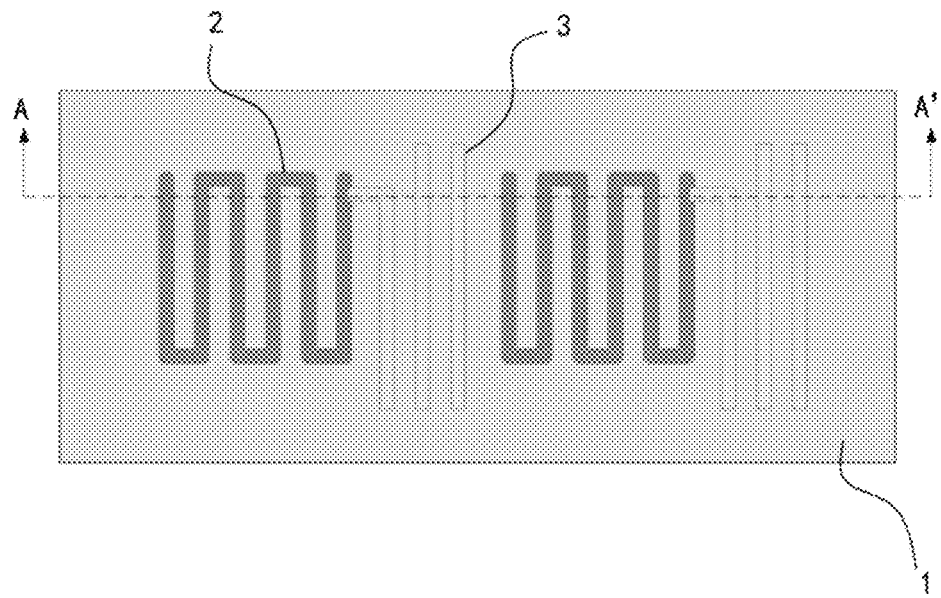
FIG. 1a schematically illustrates a schematic diagram of arrangement of a microstrip line and a control signal line in a liquid crystal phase shifter.
Figure 1B:
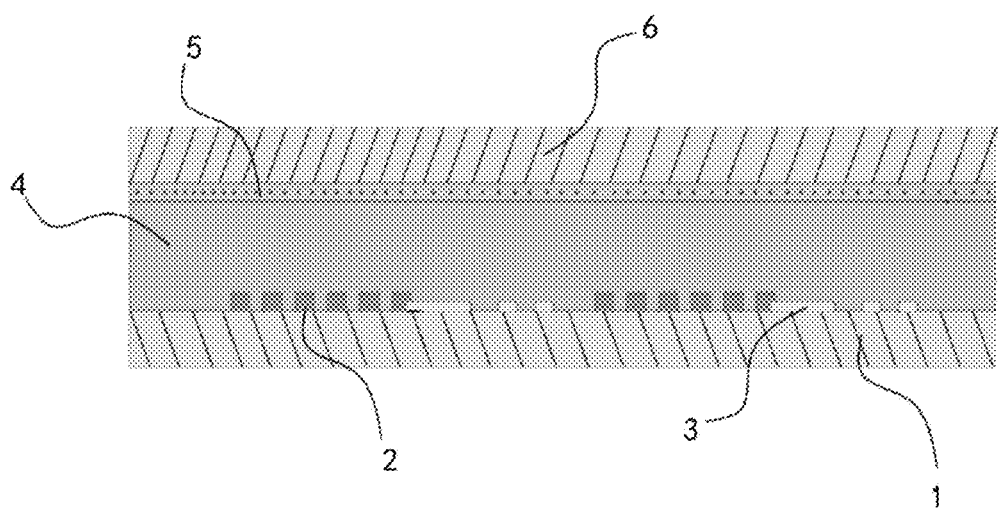
FIG. 1b is a cross-sectional view of the liquid crystal phase shifter taken along Line A-A' in FIG. 1.

FIG. 1a schematically illustrates a schematic diagram of arrangement of a microstrip line and a control signal line in a liquid crystal phase shifter. FIG. 1b is a cross-sectional view of the liquid crystal phase shifter taken along Line A-A' in FIG. 1.

As shown in FIG. 1a and FIG. 1b, the liquid crystal phase shifter includes a first base substrate 1, a plurality of microstrip lines 2, a plurality of control signal lines 3, a liquid crystal layer 4, a shielding layer 5, and a second base substrate 6.

Specifically, the microstrip line 2 is disposed on the first base substrate 1 to receive or transmit an electromagnetic wave signal. The control signal line 3 is disposed on the first base substrate 1 and positioned between adjacent microstrip lines 2. The control signal line 3 is coupled to the microstrip line 2 to apply a control voltage onto the microstrip line 2 to control arrangement of liquid crystal molecules in the liquid crystal layer 4. The liquid crystal layer 4 is disposed on the microstrip line 2, the control signal line 3, and the first base substrate 1. The shielding layer 5 is disposed on the liquid crystal layer 4 to shield the electromagnetic wave signal.

In this liquid crystal phase shifter, the arrangement of the liquid crystal molecules in the liquid crystal layer 4 is controlled by controlling the voltage between the shielding layer 5 and the microstrip line 2. Specifically, the shielding layer 5 is designed into an integral structure and is grounded or is coupled to a common voltage. The arrangement of the liquid crystal molecules in the liquid crystal layer 4 may be controlled by changing the control voltage applied to the microstrip line 2 via the control signal line 3, thus a dielectric constant of the liquid crystal layer 4 is controlled.

However, in this structure, sufficient spacing between the adjacent microstrip lines 2 is required to arrange the control signal line 3, which is disadvantageous to the compact arrangement of the liquid crystal phase shifter units (corresponding to the microstrip lines).

Furthermore, in this structure, if the distance between the control signal line 3 and the microstrip line 2 is too small, the control voltage applied onto the control signal line 3 to change the arrangement of the liquid crystal molecules in the liquid crystal phase shifter will have a negative effect on the intensity of the electromagnetic wave signal on the microstrip line in the liquid crystal phase shifter.

An exemplary arrangement of the present disclosure provides a phase shifter.

Figure 2A:
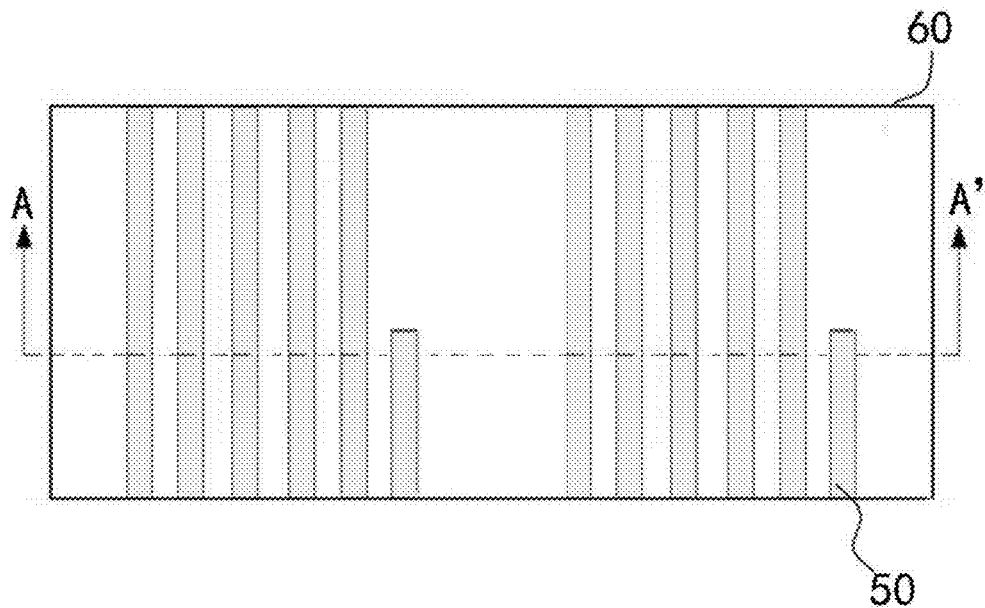
FIG. 2a schematically illustrates a schematic diagram of arrangement of a control signal line in a phase shifter according to an exemplary arrangement of the present disclosure.
Figure 2B:
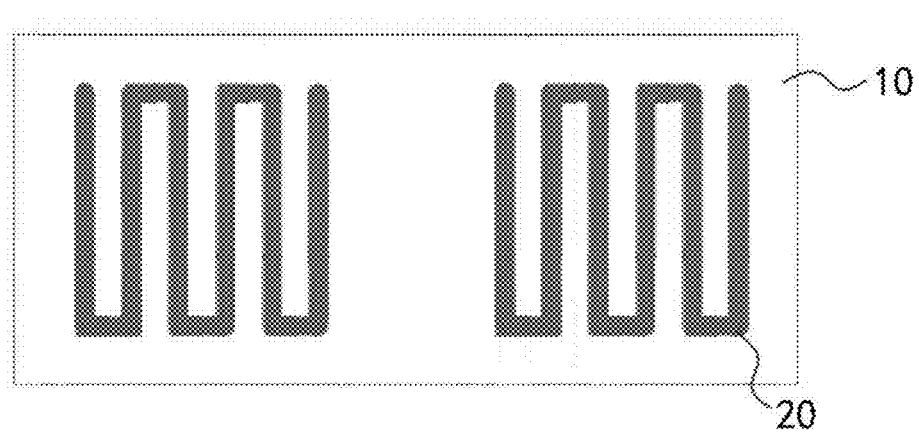
FIG. 2b schematically illustrates a schematic diagram of arrangement of a microstrip line in a phase shifter according to an exemplary arrangement of the present disclosure.
Figure 2C:
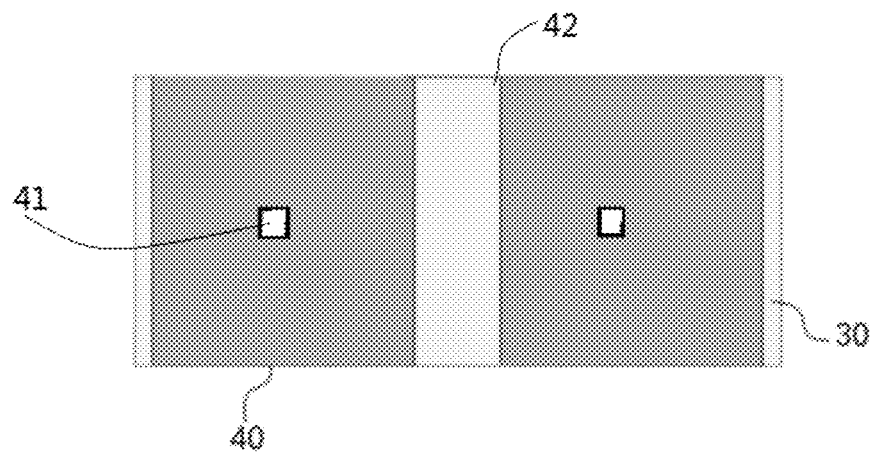
FIG. 2c schematically illustrates a schematic diagram of arrangement of a voltage control layer in a phase shifter according to an exemplary arrangement of the present disclosure.
Figure 2D:
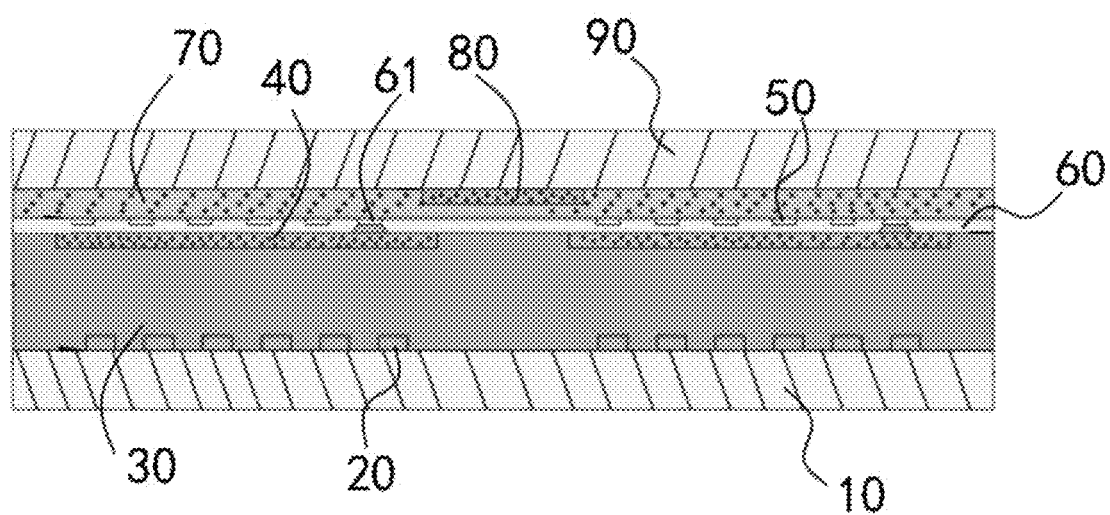

FIG. 2a schematically illustrates a schematic diagram of arrangement of a control signal line in a phase shifter according to an exemplary arrangement of the present disclosure. FIG. 2b schematically illustrates a schematic diagram of arrangement of a microstrip line in a phase shifter according to an exemplary arrangement of the present disclosure. FIG. 2c schematically illustrates a schematic diagram of arrangement of a voltage control layer in a phase shifter according to an exemplary arrangement of the present disclosure. FIG. 2d is a cross-sectional view of the phase shifter taken along Line A-A' in FIG. 2a.

Referring to FIG. 2a-2d, the phase shifter according to the exemplary arrangement of the present disclosure includes a first base substrate 10, a plurality of microstrip lines 20, a dielectric layer 30, and a plurality of separate voltage control layers 40.

The microstrip lines 20 are spaced apart from one another by gaps and are arranged on the first base substrate 10. The microstrip line 20 may transmit (receive and send) an electromagnetic wave signal and may apply a common voltage. Only two microstrip lines 20 are illustrated in the figure, however, the present disclosure is not limited thereto, and more microstrip lines 20 may be provided. In addition, although not shown in FIG. 2a-FIG. 2d, the microstrip line 20 may be coupled to a common voltage line to receive the common voltage.

In addition, as those skilled in the art would realize, the present disclosure is not limited to the microstrip lines of the shape as shown in the figures, rather, microstrip lines of any shape may be employed in the present disclosure, for example, spiral microstrip lines.

The dielectric layer 30 is disposed on the plurality of microstrip lines 20, i.e., on a side of the plurality of microstrip lines 20 away from the first base substrate 10. According to an exemplary arrangement of the present disclosure, the dielectric layer 30 may include liquid crystal. Because the liquid crystal has a higher response speed, the phase shifter which uses the liquid crystal as the dielectric layer may have a higher response speed. Furthermore, for example, the liquid crystal used herein may be a dual-frequency liquid crystal material.

A plurality of separate voltage control layers 40 are correspondingly arranged with the plurality of microstrip lines 20 respectively on a side of the dielectric layer 30 away from the first base substrate 10 and are configured to apply a control voltage.

In the above phase shifter, a dielectric constant of the dielectric layer varies with the control voltage applied to the voltage control layers and the common voltage applied to the microstrip lines.

According to an exemplary arrangement, the phase shifter may further include a plurality of separate first shielding layers disposed on a side of the dielectric layer 30 away from the first base substrate 10. In this case, the plurality of separate first shielding layers are further used as the plurality of separate voltage control layers 40. Hereinafter, it will be described that the first shielding layers are further used as the voltage control layers 40, and thus the voltage control layers 40 are referred to as the first shielding layers 40.

Here, the first shielding layer 40 may be a copper layer formed of metallic copper, but the present disclosure is not limited thereto. Any electrically conductive material that can shield an electromagnetic wave signal may be used to form the first shielding layer 40. The plurality of first shielding layers 40 are disposed independently (to be separated from each other) and correspond to the plurality of microstrip lines 20, respectively. That is, a projection of the first shielding layer 40 on the first base substrate 10 is overlapped with that of the corresponding microstrip line 20 on the first base substrate 10. According to an exemplary arrangement of the present disclosure, the first shielding layer 40 may be provided with a coupling hole 41, such that the electromagnetic wave signal may be coupled to the microstrip line via the coupling hole.

According to an exemplary arrangement, the phase shifter may further include a plurality of control signal lines 50 respectively coupled to the corresponding first shielding layers 40 and disposed on a side of the first shielding layers 40 away from the first base substrate 10, such that the control voltage is applied to the first shielding layers 40 to change the dielectric constant of the dielectric layer 30. Since the control signal line 50 is disposed away from the microstrip line 20, the control voltage applied onto the control signal line 50 does not have a negative effect on the performance of the microstrip line 20. The control signal line 50 may be formed of indium tin oxide (ITO), but the present disclosure is not limited thereto, as will be appreciated by those skilled in the art.

Here, the common voltage may be applied to the plurality of microstrip lines 20. That is, the plurality of microstrip lines 20 are supplied with the same common voltage (or common potential), or may be grounded for example, and the control voltage is applied to the plurality of first shielding layers 40 respectively via the plurality of control signal lines 50 to control the dielectric constant of the dielectric layer. According to an exemplary arrangement of the present disclosure, different control voltages may be applied to different first shielding layers 40 via different control signal lines 50, such that the phase shifter units (corresponding to the microstrip lines) have different dielectric constants.

In the above phase shifter, the control signal line for changing the dielectric constant of the liquid crystal by applying the control voltage is coupled to the side of the first shielding layer away from the microstrip line. Therefore, an adverse effect of the control voltage of the control signal line on the intensity of the electromagnetic wave signal on the microstrip line may be reduced. That is, due to a shielding effect of the first shielding layer on the control voltage, the adverse effect of the control voltage of the control signal line on the intensity of the electromagnetic wave signal on the microstrip line may be reduced.

In addition, in the above phase shifter, no sufficient spacing between the adjacent microstrip lines is required to arrange the control signal line, which can compactly arrange the phase shifter units.

According to an exemplary arrangement of the present disclosure, the phase shifter may further include a first insulating layer 60 disposed on the plurality of first shielding layers 40. In this case, the plurality of control signal lines 50 may be disposed on a surface of the first insulating layer 60 away from the first shielding layers 40. The first insulating layer 60 may be formed of an organic or inorganic low loss dielectric material to insulate the first shielding layer 40 from the control signal line 50. In addition, the control signal line 50 may be electrically coupled to the first shielding layer 40 via a through hole 61 penetrating through the first insulating layer 60 to apply the control voltage to the first shielding layer 40.

Although not shown in the drawings, according to an exemplary arrangement of the present disclosure, the plurality of control signal lines 50 may be coupled to the corresponding first shielding layers 40 via a switching unit such as a transistor. In this way, it may be controlled whether or not to apply the control voltage to the first shielding layer 40 by enabling or disabling the switching unit.

As shown in FIG. 2d, a second insulating layer 70 may be disposed on the plurality of control signal lines 50. A second shielding layer 80 may be correspondingly arranged with a gap 42 (as shown in FIG. 2c) that spaces the plurality of first shielding layers 40 from one another on the second insulating layer 70. That is, an orthographic projection of the second shielding layer 80 on the first base substrate 10 covers an orthographic projection of the gap 42 on the first base substrate 10. Here, the second shielding layer 80 may be a copper layer formed of metallic copper, but the present disclosure is not limited thereto. Any material that can shield electromagnetic wave signals may be used to form the second shielding layer 80. The second shielding layer 80 is disposed corresponding to the gap between the first shielding layers 40. Therefore, the second shielding layer 80 can prevent the electromagnetic wave signals from entering the phase shifter via the gap between the first shielding layers 40. The second shielding layer 80 may be shared by the gaps that space the plurality of first shielding layers 40. That is, the second shielding layer 80 may be designed into an integral structure.

The shielding effect of the first shielding layer 40 and the second shielding layer 80 on the electromagnetic wave signals may be implemented by larger self capacitance or a coupled DC signal.

As shown in FIG. 2d, a second base substrate 90 may be arranged on the second shielding layer 80, such that the second base substrate 90 is arranged opposite to the first base substrate 10. In FIG. 2d, it is shown that the second base substrate 90 is arranged on the second shielding layer 80, but the present disclosure is not limited thereto. For example, in the case that neither the second insulating layer 70 nor the second shielding layer 80 are provided, the second base substrate 90 may be arranged on the plurality of control signal lines 50.

Figure 3:
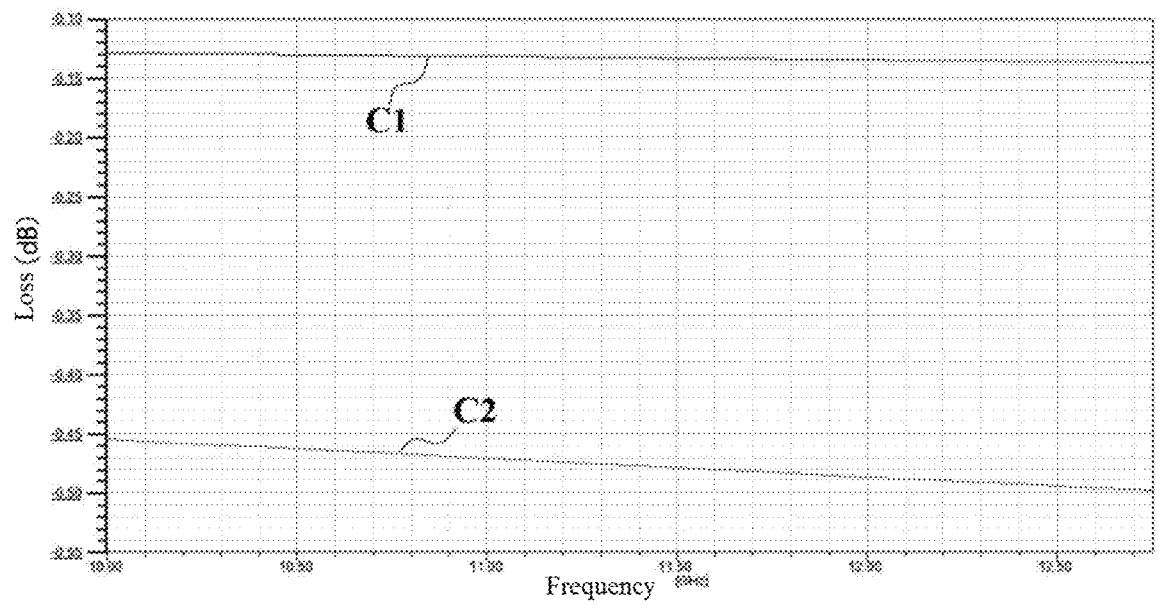
FIG. 3 schematically illustrates a simulation diagram showing an effect of a location of a control signal line on an intensity of an electromagnetic wave signal.

FIG. 3 schematically illustrates a simulation diagram showing an effect of a location of a control signal line on an intensity of an electromagnetic wave signal. Curve C1 is a simulation curve of a liquid crystal phase shifter where a control signal line is coupled to a side of a first shielding layer away from a microstrip line according to an exemplary arrangement of the present disclosure, and Curve C2 is a simulation curve of the liquid crystal phase shifter where the control signal line is disposed between the microstrip lines adjacent to each other and is coupled to the microstrip lines.

As can be seen from the simulation curves of FIG. 3, compared with the liquid crystal phase shifter where the control signal line is disposed between the microstrip lines adjacent to each other and is coupled to the microstrip lines, the liquid crystal phase shifter where the control signal line is coupled to the side of the first shielding layer away from the microstrip line according to this exemplary arrangement of the present disclosure can significantly reduce the adverse effect of the control voltage of the control signal line on the electromagnetic wave signal of the microstrip line.

Each of the phase shifter units in the phase shifter may be coupled to a separate control signal line to apply the control voltage to each of the first shielding layers. In this case, a large number of control signal lines need to be arranged. For example, as shown in FIG. 2a and FIG. 2d, on a first shielding layer 40, in addition to the control signal line 50 coupled to the first shielding layer 40, control signal lines 50 coupled to other first shielding layers 40 also extend over this first shielding layer 40. In addition, the phase shifter units according to an exemplary arrangement of the present disclosure may also be controlled by way of an active matrix. That is, each of the phase shifter units is disposed at an intersection of the scanning line and the control signal line, and the phase shifter unit to be controlled is selected through the scanning line, as described below. The number of the control signal lines can be greatly reduced by controlling the phase shifter by way of the active matrix. For example, only one control signal line extends over each first shielding layer.

An exemplary arrangement of the present disclosure also provides an antenna. The antenna includes the phase shifter described above. According to this exemplary arrangement, the phase shifter includes a plurality of separate first shielding layers arranged on a side of the dielectric layer away from the first base substrate. The plurality of separate first shielding layers are further used as the plurality of separate voltage control layers. The phase shifter also includes a plurality of control signal lines respectively coupled to the plurality of separate first shielding layers. The antenna also includes a plurality of scanning signal lines and a plurality of switching units. The plurality of scanning signal lines intersect with the plurality of control signal lines, and the plurality of control signal lines are respectively coupled to first terminals of the plurality of switching units. The plurality of first shielding layers are respectively coupled to second terminals of the plurality of switching units, and the plurality of scanning signal lines are respectively coupled to control terminals of the plurality of switching units.

Figure 4:
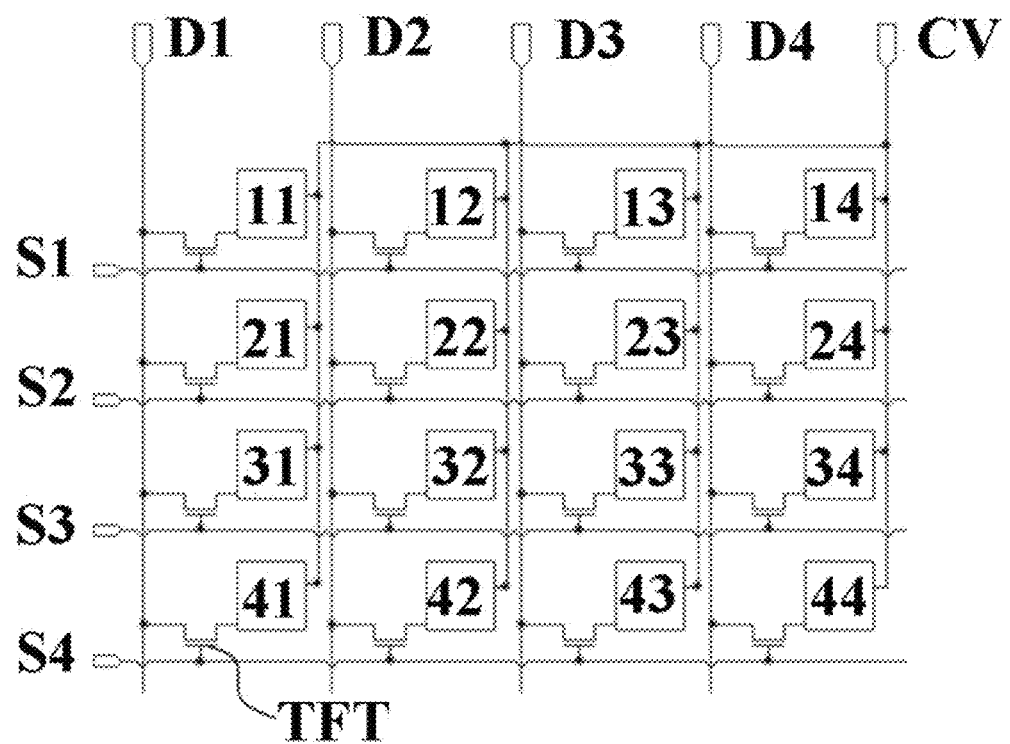
FIG. 4 schematically illustrates a schematic diagram of an antenna according to an exemplary arrangement of the present disclosure.

FIG. 4 schematically illustrates a schematic diagram of an antenna according to an exemplary arrangement of the present disclosure.

As shown in FIG. 4, the antenna includes a plurality of phase shifter units 11-44, a plurality of switching unit thin film transistors (TFTs) (such as switching transistors), a plurality of scanning lines S1-S4, a plurality of control signal lines D1-D4, and a common voltage line CV.

The plurality of phase shifter units 11-44 may together constitute the phase shifter described above with reference to FIG. 2a-FIG. 2d. That is, the phase shifter described above with reference to FIG. 2a-FIG. 2d may be divided into a plurality of phase shifter units according to a plurality of microstrip lines.

The plurality of control signal lines D1-D4 are coupled to the plurality of phase shifter units 11-44 via the switching unit TFTs, respectively. Specifically, the control signal line D1 is coupled to a plurality of phase shifter units 11-41 in a column via the switching unit TFTs. The control signal line D2 is coupled to a plurality of phase shifter units 12-42 in a column via the switching unit TFTs. The control signal line D3 is coupled to a plurality of phase shifter units 13-43 in a column via the switching unit TFTs. The control signal line D4 is coupled to a plurality of phase shifter units 14-44 in a column via the switching unit TFTs.

The plurality of scanning lines S1-S4 intersect with the plurality of control signal lines D1-D4 and are coupled to control terminals of the switching unit TFTs to enable or disable the switching unit TFTs. Specifically, the scanning line S1 is coupled to the control terminals of a plurality of switching unit TFTs respectively corresponding to a plurality of phase shifter units 11-14 in a row. The scanning line S2 is coupled to the control terminals of a plurality of switching unit TFTs respectively corresponding to a plurality of phase shifter units 21-24 in a row. The scanning line S3 is coupled to the control terminals of a plurality of switching unit TFTs respectively corresponding to a plurality of phase shifter units 31-34 in a row. The scanning line S4 is coupled to the control terminals of a plurality of switching unit TFTs respectively corresponding to a plurality of phase shifter units 41-44 in a row.

In addition, a plurality of microstrip lines of the plurality of phase shifter units 11-44 are jointly coupled to the common voltage line CV to receive the common voltage. Since the plurality of microstrip lines receive the same common voltage through the common voltage line CV, the common voltage line CV may be coupled to the plurality of microstrip lines in the shortest way without complicated wire wrapping to ensure the common voltage lines coupled to the plurality of microstrip lines to have an equal length.

For convenience of illustration in FIG. 4, a plurality of scanning lines S1-S4 and a plurality of control lines D1-D4 are shown as being between the plurality of liquid crystal phase shifter units 11-44. However, as described above, actually, the plurality of scanning lines S1-S4 and the plurality of control signal lines D1-D4 are disposed on the first shielding layers of the plurality of phase shifter units 11-44. In this way, it may be prevented that control signals or voltages of the scanning lines S1-S4 and the control signal lines D1-D4 have a negative effect on the performance of the microstrip lines in the phase shifter units 11-44.

In addition, an exemplary arrangement of the present disclosure also provides a control method of the phase shifter, which includes: applying a common voltage to the plurality of microstrip lines; and applying a control voltage to the plurality of separate voltage control layers respectively to control a dielectric constant of a dielectric layer.

According to an exemplary arrangement of the present disclosure, the dielectric constant of the dielectric layer may be changed by changing the control voltage applied to the plurality of voltage control layers (first shielding layers) via the plurality of control signal lines, respectively.

Figure 5:
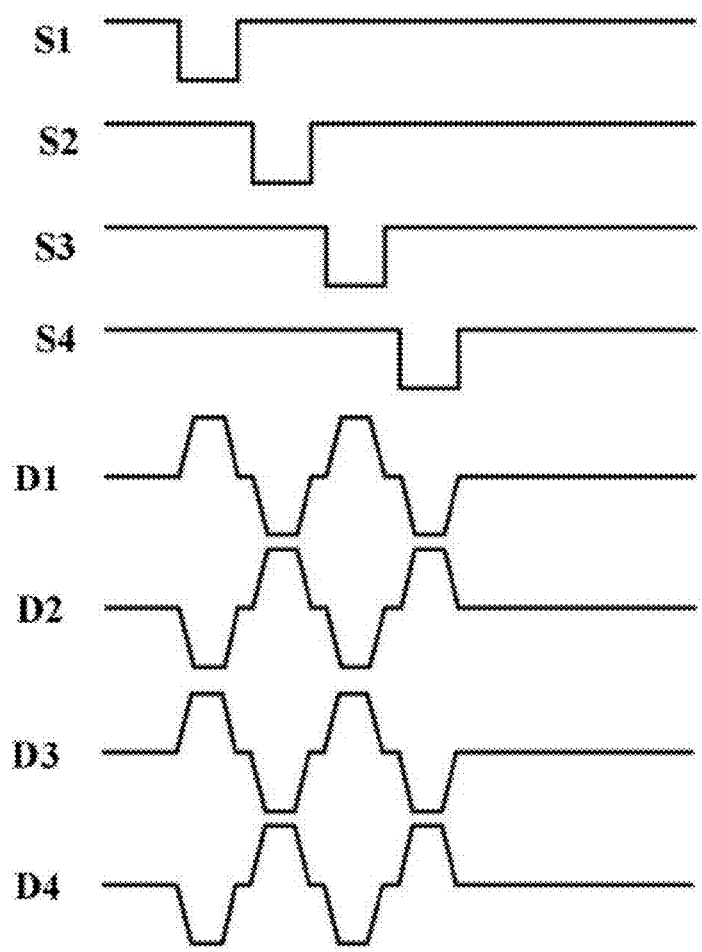
FIG. 5 illustrates a timing diagram of a scan line and a control signal line of a liquid crystal phase shifter of the antenna as shown in FIG. 4.

In addition, referring to FIG. 4, the voltage of the first shielding layer of the phase shifter may be controlled by way of the active matrix to control the dielectric constant of the liquid crystal layer of the phase shifter. For example, the voltages of the plurality of microstrip lines of the phase shifter may be set to be the common voltage, and then the first shielding layer to which the control voltage is to be applied is selected via the scanning line by way of the active matrix. In this way, efficient and rapid control of a large number of phase shifter units may be achieved. For example, the dielectric constant of the phase shifter unit may be controlled in blocks or rows. FIG. 5 illustrates a timing diagram of a control method of a liquid crystal phase shifter of the antenna as shown in FIG. 4.

The foregoing description of the particular exemplary arrangements of the present disclosure has been given with reference to the accompanying drawings. These exemplary arrangements are not intended to be exhaustive or limit the present disclosure to be the disclosed exact construction, and apparently, various modifications and changes can be made by those of ordinary skill in the art under the enlightenment the above teachings. Therefore, the scope of the present disclosure is not intended to be restricted to the foregoing arrangements but is intended to be limited by the claims and their equivalents.

What is claimed is:

1. A phase shifter, comprising:
a first base substrate;
a plurality of microstrip lines arranged on the first base substrate, and configured to transmit an electromagnetic wave signal and be applied with a grounded voltage;
a dielectric layer, arranged on a side of the plurality of microstrip lines away from the first base substrate;
a plurality of separate voltage control layers arranged on a side of the dielectric layer away from the first base substrate, corresponding to the plurality of microstrip lines respectively, and configured to be applied with a control voltage; and
a plurality of control signal lines respectively coupled to the plurality of separate voltage control layers and arranged on a side of the plurality of separate voltage control layers away from the first base substrate,
wherein an orthographic projection of a microstrip line on the first base substrate is within an orthographic projection of a corresponding voltage control layer on the first base substrate,
wherein a dielectric constant of the dielectric layer is varied with the control voltage applied to the separate voltage control layers and the grounded voltage applied to the microstrip lines,
wherein the plurality of separate voltage control layers are configured to shield the electromagnetic wave signal transmitted by the plurality of microstrip lines and not transmit the electromagnetic wave signal.

2. The phase shifter according to claim 1, further comprising: a first insulating layer arranged on the side of the plurality of separate voltage control layers away from the first base substrate,
wherein the plurality of control signal lines are located on a side of the first insulating layer away from the separate voltage control layers.

3. The phase shifter according to claim 2, wherein one of the control signal lines is coupled to one of the separate voltage control layers via a through hole penetrating through the first insulating layer.

4. The phase shifter according to claim 1, wherein one of the separate voltage control layers is provided with a coupling hole, and wherein the electromagnetic wave signal is coupled to the microstrip line via the coupling hole.

5. The phase shifter according to claim 1, wherein the dielectric layer comprises a liquid crystal.

6. The phase shifter according to claim 1, further comprising: a second base substrate arranged opposite to the first base substrate, wherein the control signal lines and the separate voltage control layers are sequentially arranged on the second base substrate in a direction away from the second base substrate.

7. The phase shifter according to claim 1, wherein the plurality of separate voltage control layers are spaced apart from each other by a gap.

8. The phase shifter according to claim 7, further comprising: a shielding layer arranged on a side of the control signal lines away from the separate voltage control layers, wherein an orthographic projection of the shielding layer on the first base substrate covers an orthographic projection of the gap on the first base substrate.

9. The phase shifter according to claim 1, wherein the plurality of microstrip lines are coupled to a common voltage line.

10. The phase shifter according to claim 1, wherein the plurality of control signal lines are respectively coupled to the plurality of separate voltage control layers via a switching unit.

11. An antenna, comprising the phase shifter according to claim 1.

12. The antenna according to claim 11, wherein the antenna further comprises a plurality of scanning signal lines and a plurality of switching units, the plurality of scanning signal lines intersect with the plurality of control signal lines, the plurality of control signal lines are respectively coupled to first terminals of the plurality of switching units, the plurality of separate voltage control layers are respectively coupled to second terminals of the plurality of switching units, and the plurality of scanning signal lines are respectively coupled to control terminals of the plurality of switching units.

13. The antenna according to claim 12, wherein one of the separate voltage control layers is provided with a coupling hole, and wherein the electromagnetic wave signal is coupled to the microstrip line via the coupling hole.

14. The antenna according to claim 11, wherein the phase shifter further comprises: a first insulating layer arranged on the side of the plurality of separate voltage control layers away from the first base substrate, wherein the plurality of control signal lines are located on a side of the first insulating layer away from the separate voltage control layers.

15. The antenna according to claim 14, wherein one of the control signal lines is coupled to one of the separate voltage control layers via a through hole penetrating through the first insulating layer.

16. The antenna according to claim 11, wherein the plurality of microstrip lines are coupled to a common voltage line.

17. The antenna according to claim 11, wherein the plurality of separate voltage control layers are spaced apart from each other by a gap.

18. The antenna according to claim 17, wherein the phase shifter further comprises: a shielding layer arranged on a side of the control signal lines away from the separate voltage control layers, wherein an orthographic projection of the shielding layer on the first base substrate covers an orthographic projection of the gap on the first base substrate.

19. A method of controlling the phase shifter according to claim 1, comprising:

applying a grounded voltage to the plurality of microstrip lines; and applying a control voltage to the plurality of separate voltage control layers respectively to control a dielectric constant of the dielectric layer.

* * * * *